United States Patent [19]

Packer et al.

[11] 4,340,167

[45] Jul. 20, 1982

[54] COATED PRINTED CIRCUIT WIRING BOARD AND METHOD OF SOLDERING

[75] Inventors: Marvin Packer, Broomall, Pa.; Otis D. Black, Willingboro, N.J.

[73] Assignee: RCA Corporation, New York, N.Y.

[21] Appl. No.: 88,556

[22] Filed: Oct. 26, 1979

Related U.S. Application Data

[62] Division of Ser. No. 864,624, Dec. 27, 1977, Pat. No. 4,215,025.

[51] Int. Cl.³ .......................... B23K 1/02; H05K 3/34
[52] U.S. Cl. ................................ 228/180 R; 174/68.5
[58] Field of Search ............... 228/180 R, 223, 20; 174/68.5; 260/29.2 R, 29.4, 29.6 R, 29.6 HN, 29.6 ME

[56] References Cited

U.S. PATENT DOCUMENTS

| | | | |
|---|---|---|---|
| 3,067,159 | 12/1962 | Musser | 260/29.4 R |
| 3,256,247 | 6/1966 | Gagliardi et al. | 260/29.4 R |
| 3,296,208 | 1/1967 | Rogers | 260/29.4 R |
| 3,296,208 | 1/1967 | Rogers | 260/29.4 R |
| 3,649,597 | 3/1972 | Henley, Jr. | 260/29.4 R X |
| 3,954,494 | 5/1976 | Stayner et al. | 148/25 X |
| 3,966,110 | 6/1976 | Boynton | 228/18 X |
| 3,973,322 | 8/1976 | Boynton | 29/741 X |
| 4,113,524 | 9/1978 | Katz | 148/23 |
| 4,143,005 | 3/1979 | Packer | 228/180 R X |

OTHER PUBLICATIONS

"Dantoin 684", *Technical Bulletin A*-101, published by GLYCO Chemicals, Inc., of Greenwich, Conn.
"Commercial Types of PVP", Information published by GLYCO Chemicals, Inc., pp. 3-4.
"Carbowax", (page 7 from *Physical Properties Determined on commercial materials*), GLYCO Chemicals, Inc.

*Primary Examiner*—Kenneth J. Ramsey
*Attorney, Agent, or Firm*—H. Christoffersen; Birgit E. Morris; Edward J. Sites

[57] ABSTRACT

Components can be held down on printed circuit boards by applying compositions comprising a water soluble polymeric compound or mixture of compounds which can be dissolved in water to give a greater than 45% solids content with a viscosity range of about 8 to about 12 poises at about 25° C., a water soluble mono- or polyhydric alcohol, water, a wetting agent, and a water soluble organic acid having a keto oxygen group within 4 carbon atoms of the carboxylic acid group, to the printed circuit board prior to insertion of the components to keep them in place during soldering operations. The mixture can be completely removed after soldering by a water rinse.

9 Claims, No Drawings

COATED PRINTED CIRCUIT WIRING BOARD AND METHOD OF SOLDERING

This is a division of application Ser. No. 864,624, filed Dec. 27, 1977, now U.S. Pat. No. 4,215,025.

This invention relates to a composition for and a method of assembling components on printed circuit boards. More particularly, this invention relates to a tacky, water soluble, non-flowing composition to hold components on printed circuit boards in place during soldering operation.

BACKGROUND OF THE INVENTION

In a general method of assembling components on printed circuit boards, the component leads are mounted through holes punched in the board for that purpose and the leads are then clinched, or bent, to hold the components in place during subsequent fluxing, lead cutting and soldering operations. The leads are soldered to the boards and the excess cut off. In many cases, the cut lead ends must be resoldered. These operations require hand labor and many steps, which of course is expensive. Also, solder is lost on the discarded lead ends. Further, when a double soldering step is required, the danger of board warping, due to the high temperatures employed during soldering, is increased.

With the increased complexity of electronic devices, more components are mounted on the boards which magnifies the problems. The clinched leads on the boards interfere with each other, necessitating a stepwise compound mounting whereby part of the components are assembled, soldered and their leads cut off before mounting additional components.

Further, it is most difficult to remove faulty components which must be replaced or repaired when the leads have been clinched, without damaging the board or other adjacent components. Still further, access to both sides of the board is required.

Thus, other ways of assembling printed circuit board components without clinching leads have been sought. Among other methods, components grippers, clamps and compressible foam pads, and bags loaded with small particles, e.g., beans or plastic shot, placed over the components to hold them in place, have been proposed and used to hold electronic components in place on printed circuit boards during soldering operations.

According to another method that has been tried, a molten wax coating is applied to the bottom of the board after the component leads have been inserted into the holes. After the wax cools and hardens, it holds the components in place while the leads are cut and soldered. While this method is adaptable to automatic soldering operations and pre-cutting of leads, the wax smokes during soldering operations and requires organic solvents or hot water in excess of 150° F. (65.56° C.) to effect its removal. In addition, a second flux over the wax coating is required, in some instances, for automatic soldering operations.

Application Ser. Nos. 771,680, filed Feb. 24, 1977; 771,679, filed Feb. 24, 1977; and 834,279, filed Sept. 19, 1977, U.S. Pat. Nos. 4,115,157; 4,113,524; and 4,143,005, respectively, assigned to the same assignee, solved the above problems through the use of extrudable, non-flowable, water or solvent soluble compositions that can be readily applied over the components assembled on the printed circuit boards to hold the components in place without lead clinching during the solder operation. However, the extrudable compositions do not permit the correction of improperly inserted components into the printed circuit board until after the completion of soldering operations.

Thus, it would be desirable to provide a method of assembling components on printed circuit boards that will permit corrections to be made in the circuit board wiring before soldering operations and maintain the unclinched components in place during soldering operations.

SUMMARY OF THE INVENTION

A non-flowing, completely water soluble composition has been found that can be readily applied over the components assembled on printed circuit boards by spraying or other suitable techniques. The composition permits corrections to be made in improperly assembled printed circuit boards before soldering and will maintain the components in place on a printed circuit board, without clinching leads, during soldering operations. The composition comprises a water soluble polymeric compound or mixture of compounds which can be dissolved in a water or a water-alcohol mixture, a water soluble mono- or polyhydric alcohol, water, a wetting agent, and a carboxylic acid having a keto oxygen group within 4 carbon atoms of the carboxylic acid group.

DETAILED DESCRIPTION OF THE INVENTION

The water soluble polymeric compound or mixtures of compounds suitable for the use in the invention must be compatible with the other components of the composition. Compatible as employed herein means miscible and able to form a single phase. Illustrative compounds include polyethylene glycols having melting points greater than about 40° C. such as Carbowax 1540, 4000, and 6000 (products of Union Carbide Corp.) polyvinyl pyrrolidones with an average molecular weight of about 40,000 (products of the GAF Corp.), and dimethyl hydantoin formaldehyde resin with an average molecular weight of from about 240 to about 300 (a product of Glyco Chemical, Inc.).

The polymeric compound must be able to form a solution with a dissolved solids content of at least about 45% by weight and have a viscosity range of between about 8 to about 12 poises at about 25° C. Although within the scope of the invention, solutions with solids content lower than about 45% by weight require an excessive amount of spraying time to apply a sufficient amount of the composition which, when dry, will hold components on printed circuit boards without lead clinching. Solutions having a solids content higher than 65% by weight may be used; however, a high solid content solution may require the use of heated spray guns to apply the composition. A dry film thickness of about 4 or 5 mils is sufficient to adhere the components to the printed wiring board without lead clinching during soldering operations.

A preferred embodiment of the invention incorporates dimethyl hydantoin formaldehyde resin as the polymeric compound. The final composition is then completely transparent to light, which enables the tacky dry film to be used in conjunction with the fiber optic component locating devices such as are described in U.S. Pat. Nos. 2,959,848; 3,216,101; 3,372,455; 3,548,493 and 3,611,544.

When a fiber optic locating system is not employed, the transparency of the dry film is not crucial and therefore, any water soluble polymeric compound or mixture of compounds which are compatible with the other components of the composition and will adhere the components to printed circuit boards is within the scope of the invention.

Mono-, di-, or polyhydric alcohols and water are used in the composition as solvents to make the mixture fluid enough to be sprayed on the printed circuit boards. Although not deleterious to the composition, excessive amounts of solvents require greater spraying times to build up a dry film thickness of about 4 or 5 mils.

Suitable alcohols are methanol, ethanol, propanol, ethylene glycol, propylene glycol, 1,4-butanediol, glycerol, and preferably, for most applications, because of cost and availability, isopropyl alcohol.

Sufficient amounts of wetting agents are added to the composition to permit the final mixture to flow smoothly and have a uniform dry film thickness when applied to the printed circuit board. Anionic, cationic, and nonionic wetting agents are within the scope of the invention. Nonionic wetting agents are preferred because trace amounts of the composition, which may remain on the printed circuit board after rinsing operations will not corrode or adversely affect the electronic components.

Examples of suitable wetting agents are Triton X-100 (Rohm & Haas Chemical Company), NPX, TMN, XD (products of the Union Carbide Corp.) and the nonionic wetting agents of American Cyanamid Co. and Wyandotte Chemical.

A water soluble organic acid having a keto oxygen group within 4 carbon atoms of the carboxylic acid group is added to clean the metal surfaces on the printed circuit board which may be oxidized prior to soldering. Cleaning the metal contacts improves the solderability of the printed circuit board and ensures good electrical contact. The keto group may be closer to the carboxylic acid than the 4th carbon atom however, when the keto group is further away from the carboxylic acid than the 4th carbon atom, the acid tends to lose its cleaning properties. The carboxylic acid preferably is inexpensive and readily available. Suitable keto acids are, for example, pyruvic acid, homolevulinic acid ($\phi$-ketocaproic acid), acetoacetic acid, and levulinic acid.

The exact proportions of the several ingredients are not critical. For 100 parts by weight of the polymeric compound, from 10 to about 40 parts by weight of a mono- or polyhydric alcohol, from 10 to about 40 parts by weight of water, from about 1 to about 4 parts by weight of wetting agent, and from 0.01 to about 6 parts by weight of carboxylic acid can be employed.

The individual components of the composition are mixed together by any suitable method known in the art, such as stirring, until a one phase system is achieved and all the components are sufficiently dissolved to form a sprayable mixture. Although the water-alcohol concentration ranges are the same, the alcohol-water concentrations may but do not have to be in a 1:1 ratio.

The exact concentration of the polymeric compound depends upon the desire to apply a 4 to 5 mil dry film thickness without extended spraying times. For examples, if Carbowax 4000 is selected then 100 parts by weight of a 75% solution would give a final composition with a solids content within the desired range. If a more viscous Carbowax, i.e., Carbowax 6000 was selected, then its concentration of 100 parts by weight added need only be about a 50% solution.

Printed circuit boards may be preprocessed with our composition and permitted to dry. The dry coating is substantially tackless and thus is easily stored. The dry coating may be reactivated with a 50/50 mixture of a mono- or polyhydric alcohol and water prior to insertion of the components. Upon reactivation, the dry film becomes tacky and adheres the components to the printed circuit board without lead clinching during soldering operations. Components applied during the tacky period of the film do not dislodge when the film subsequently dries.

In the described method of soldering components to printed circuit boards, whereby the foregoing mixtures are applied to the printed circuit board, the components soldered and the mixture washed away, an added advantage is that the component leads may be pretrimmed to a uniform length prior to mounting on the boards, thus obviating the need for cutting leads after the components are mounted.

The invention will be further illustrated by the following Examples but it is to be understood that the invention is not meant to be limited to the details described therein. In the Examples all parts are by weight.

EXAMPLE 1

Part A

A mixture was made of 100 parts of a 75% solution of dimethyl hydantoin formaldehyde resin, 16.5 parts of isopropyl alcohol, 16.5 parts of water, 1.5 parts by Triton X-100, and 3 parts of levulinic acid. The respective components were mixed together into a completely clear solution and sprayed onto printed circuit boards.

Part B

Several circuit boards prepared as in Part A were used immediately with RCA's low cost fiber optic programming fixture board. The lights from the fiber optic board glowed clearly through the transparent coating and workers were able to assemble printed circuit boards with components having pretrimmed leads. Dry boards were reactivated with a 50/50 solution of isopropyl alcohol and water prior to insertion of the components.

Part C

Printed circuit boards with a coating of the composition according to Part A and mounted with electronic components as described in Part B, were placed in an automatic soldering machine and passed over the water soluble flux Alpha 30 (a product of Alpha Metals Company of Jersey City, N.J.) and a standing soldering wave consisting of 63% tin and 37% lead alloy. The soldering temperature was about 500° F.±10° F. (260° C.±5.5° C.) and the soldering time was about 2 to about 4 seconds. After soldering, the composition was rinsed from the pretrimmed, nonclinched components and circuit boards with a water rinse of from about 1 to about 5 minutes at a water temperature of about 170° F.±10° F. (76.67±5.5° C.). Finally, the boards were subjected to an additional water rinse for about 5 minutes at water temperature from room temperature to about 140° F. (60° C.). Pretrimmed, nonclinched, components of various sizes were successfully soldered with our invention.

EXAMPLE 2

Part A

A mixture was made of 100 parts of a 75% solution of dimethyl hydantoin formaldehyde resin, 25 parts of isopropyl alcohol, 25 parts of water, 2.5 parts by weight of Triton X-100 and 0.1 parts of levulinic acid. The mixture formed a transparent, non-flowing, room temperature sprayable mixture which was successfully used to hold components down on printed circuit boards during soldering operations in accordance with Parts B and C of Example 1.

EXAMPLE 3

100 Parts by weight of Carbowax 4000, 35 parts of glycerol, 40 parts of water, 4 parts of Triton X-100 and 1 part of levulinic acid are mixed together. The composition is sprayed on printed circuit boards at room temperature until a thickness of about 4 to about 5 mils, when dry, is obtained. The mixture can be used successfully to hold pretrimmed, nonclinched, components of various sizes on printed circuit boards during soldering operations.

We claim:

1. A method of soldering components to printed circuit boards which comprises the ordered steps of:
   (a) coating a first side of a printed circuit board with a mixture comprised of 100 parts by weight of a water soluble polymeric compound or mixture of compounds which can be dissolved in water to give greater than about a 45% by weight solids content and a viscosity range of about 8 to about 12 poises at about 25° C., about 10 to about 40 parts by weight of isopropyl alcohol, about 10 to about 40 parts by weight of water, about 1 to about 4 parts by weight of a nonionic wetting agent, and about 0.1 to about 6 parts by weight of a water soluble organic acid having a keto-oxygen group within 4 carbon atoms of the carboxylic acid group,
   (b) drying the coated printed circuit board to remove a sufficient amount of the water and isopropyl alcohol to convert the applied mixture into a dry transparent, non-flowing, water soluble film on the first surface,
   (c) activating the film with a blend of alcohol and water so as to make the film tacky,
   (d) adhering the components to the tacky film on the first side of said printed circuit board,
   (e) fluxing the opposite side of the printed circuit board,
   (f) soldering the fluxed side of the printed circuit board, and
   (g) rinsing the film from the first surface of the printed circuit board.

2. A method according to claim 1 wherein the mixture is comprised of 100 parts by weight of a 75% by weight solution of dimethyl hydantoin formaldehyde resin, 16.5 parts by weight of isopropyl alcohol, about 16.5 parts by weight of water, about 1.5 parts by weight of a nonionic wetting agent, and about 3 parts by weight of levulinic acid.

3. A method according to claim 1 wherein the polymeric compound is selected from the group consisting of polyethylene glycol, polyvinyl pyrrolidone, and dimethyl hydantoin formaldehyde resin.

4. The method according to claim 1 wherein the carboxylic acid is selected from the group consisting of pyruvic acid, homolevulinic acid, acetoacetic acid, and levulinic acid.

5. The method according to claim 1 wherein the mixture is comprised of 100 parts by weight of a polyethylene glycol with an average molecular weight range of about 3000 to about 3700, about 35 parts by weight of glycerol, about 40 parts by weight of water, about 4 parts by weight of a wetting agent, and about 1 part by weight of levulinic acid.

6. A printed circuit board capable of having electronic components adhered thereto during soldering operations comprising a printed circuit board, and a transparent non-flowing water soluble film on a side of said printed circuit board upon which said components are to be adhered said film being obtained by coating said side with a mixture comprised of 100 parts by weight of a water soluble polymeric compound or mixtures of compounds which can be dissolved in water to give a greater than about 45% by weight solids content, and a viscosity range of about 8 to about 12 poises at about 25° C., about 10 to about 40 parts by weight of isopropyl alcohol, about 10 to about 40 parts by weight of water, about 1 to about 4 parts by weight of a wetting agent, and about 0.1 to about 6 parts by weight of a water soluble organic acid having a keto oxygen group within 4 carbon atoms of the carboxylic acid group and thereafter drying said coating to remove sufficient water and alcohol to form said transparent non-flowing water soluble film on said side.

7. The coated printed circuit board according to claim 6 wherein the mixture contains a polymeric compound selected from the group consisting of polyethylene glycol, polyvinyl pyrrolidone, and dimethyl hydantoin formaldehyde resin.

8. The printed circuit board according to claim 7 wherein the carboxylic acid is selected from the group consisting of pyruvic acid, homolevulinic acid, acetoacetic acid, and levulinic acid.

9. The printed circuit board according to claim 8 further incorporating electronic components inserted into said circuit board on said side having said film.

* * * * *